(12) United States Patent
Baek et al.

(10) Patent No.: US 10,474,868 B2
(45) Date of Patent: Nov. 12, 2019

(54) FAN-OUT SEMICONDUCTOR PACKAGE

(71) Applicant: SAMSUNG ELECTRO-MECHANICS CO., LTD., Suwon-Si, Gyeonggi-Do (KR)

(72) Inventors: Yong Ho Baek, Suwon-Si (KR); Jung Hyun Cho, Suwon-Si (KR); Byoung Chan Kim, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 10 days.

(21) Appl. No.: 15/951,677

(22) Filed: Apr. 12, 2018

(65) Prior Publication Data

US 2018/0232556 A1  Aug. 16, 2018

Related U.S. Application Data

(63) Continuation of application No. 15/663,304, filed on Jul. 28, 2017, now Pat. No. 10,061,967.

(30) Foreign Application Priority Data

Aug. 22, 2016 (KR) .................... 10-2016-0106218
Oct. 21, 2016 (KR) .................... 10-2016-0137663

(51) Int. Cl.
*H05K 1/18* (2006.01)
*G06K 9/00* (2006.01)
(Continued)

(52) U.S. Cl.
CPC ....... *G06K 9/00053* (2013.01); *G06K 9/0002* (2013.01); *H01L 21/561* (2013.01);
(Continued)

(58) Field of Classification Search
CPC .............. G06K 9/0002; G06K 9/00053; H01L 21/561; H01L 21/568; H01L 21/768;
(Continued)

(56) References Cited

U.S. PATENT DOCUMENTS 8,432,022 B1    4/2013  Huemoeller et al.
8,717,775 B1 *  5/2014  Bolognia ........... G06K 9/00053
                                                              361/761
(Continued)

FOREIGN PATENT DOCUMENTS

CN      103168358 A    6/2013
JP      2012-039090 A  2/2012
(Continued)

OTHER PUBLICATIONS

Notice of Allowance issued in related parent U.S. Appl. No. 15/663,304, dated May 24, 2018.
(Continued)

*Primary Examiner* — Yuriy Semenenko
(74) *Attorney, Agent, or Firm* — Morgan, Lewis & Bockius LLP

(57) ABSTRACT

A fan-out semiconductor package includes: a first connection member having a through-hole; a semiconductor chip disposed in the through-hole of the first connection member and having an active surface with connection pads disposed thereon and an inactive surface opposing the active surface; an encapsulant encapsulating at least portions of the first connection member and the semiconductor chip; and a second connection member disposed on the first connection member and the semiconductor chip. The first connection member and the second connection member respectively include first redistribution layers and second redistribution layers electrically connected to the connection pads and formed of one or more layers, at least one of the first
(Continued)

redistribution layers is disposed between a plurality of insulating layers of the first connection member, and at least one of the second redistribution layers includes sensor patterns recognizing a fingerprint.

20 Claims, 18 Drawing Sheets

(51) Int. Cl.
*H01L 21/56* (2006.01)
*H01L 21/768* (2006.01)
*H01L 23/00* (2006.01)
*H01L 23/31* (2006.01)

(52) U.S. Cl.
CPC .......... *H01L 21/568* (2013.01); *H01L 21/768* (2013.01); *H01L 23/3128* (2013.01); *H01L 24/17* (2013.01); *H01L 24/19* (2013.01); *H01L 24/20* (2013.01); *H01L 24/24* (2013.01); *H01L 24/25* (2013.01); *H01L 24/26* (2013.01); *H01L 24/05* (2013.01); *H01L 24/13* (2013.01); *H01L 2224/0235* (2013.01); *H01L 2224/02375* (2013.01); *H01L 2224/02379* (2013.01); *H01L 2224/02381* (2013.01); *H01L 2224/0401* (2013.01); *H01L 2224/04105* (2013.01); *H01L 2224/05559* (2013.01); *H01L 2224/05569* (2013.01); *H01L 2224/05572* (2013.01); *H01L 2224/12105* (2013.01); *H01L 2224/13023* (2013.01); *H01L 2224/13024* (2013.01); *H01L 2224/16238* (2013.01); *H01L 2224/18* (2013.01); *H01L 2224/20* (2013.01); *H01L 2224/221* (2013.01); *H01L 2224/244* (2013.01); *H01L 2224/24155* (2013.01); *H01L 2224/25171* (2013.01); *H01L 2224/25175* (2013.01); *H01L 2924/15153* (2013.01)

(58) Field of Classification Search
CPC ..... H01L 23/3128; H01L 24/17; H01L 24/19; H01L 24/26
See application file for complete search history.

(56) References Cited

U.S. PATENT DOCUMENTS

| | | | |
|---|---|---|---|
| 9,406,580 | B2 | 8/2016 | Erhart et al. |
| 2009/0237900 | A1* | 9/2009 | Origuchi ........... H01L 23/49838 361/763 |
| 2011/0024899 | A1 | 2/2011 | Masumoto et al. |
| 2011/0259630 | A1* | 10/2011 | Park ........................ H01L 23/13 174/260 |
| 2012/0013021 | A1 | 1/2012 | Kobayashi et al. |
| 2014/0047706 | A1* | 2/2014 | Shaikh ................. G06K 9/0002 29/622 |
| 2014/0070396 | A1* | 3/2014 | Kyozuka ................. H01L 24/19 257/698 |
| 2014/0106508 | A1* | 4/2014 | Sutardja ................. H01L 24/24 438/109 |
| 2015/0102502 | A1 | 4/2015 | Chiu et al. |
| 2016/0027766 | A1 | 1/2016 | Chung |
| 2017/0345731 | A1* | 11/2017 | Chiang ............... H01L 23/3128 |

FOREIGN PATENT DOCUMENTS

| | | |
|---|---|---|
| JP | 2012-39090 A | 2/2012 |
| KR | 10-2013-0132163 A | 4/2013 |
| KR | 10-2013-0132163 A | 12/2013 |
| KR | 10-2016-0024379 A | 3/2016 |
| TW | M491885 U | 12/2014 |
| TW | M522420 U | 5/2016 |
| WO | 2012/012338 A1 | 1/2012 |
| WO | 2015/026344 A1 | 2/2015 |

OTHER PUBLICATIONS

Taiwanese Office Action issued in corresponding Taiwanese Patent Application No. 106123426, dated Jan. 22, 2018, with English Translation.
Non-Final Office Action issued in related parent U.S. Appl. No. 15/663,304, dated Feb. 5, 2018.
Korean Office Action dated Oct. 17, 2018 issued in Korean Patent Application No. 10-2016-0137663 (with English translation).
Office Action issued in Korean Application No. 10-2016-0137663 dated Oct. 17, 2018, with English translation.

* cited by examiner

II-II'

FAN-OUT SEMICONDUCTOR PACKAGE

CROSS-REFERENCE TO RELATED APPLICATION(S)

This application is a Continuation of U.S. patent application Ser. No. 15/663,304, filed Jul. 28, 2017, which claims benefit of priority to Korean Patent Application Nos. 10-2016-0106218 filed on Aug. 22, 2016 and 10-2016-0137663 filed on Oct. 21, 2016 in the Korean Intellectual Property Office, the disclosures of which are incorporated herein by reference in their entirety.

TECHNICAL FIELD

The present disclosure relates to a fan-out semiconductor package, and more particularly, to a fan-out semiconductor package having a fingerprint recognition function.

BACKGROUND

Recently, a significant trend in the development of technology related to semiconductor chips has been reductions in the size of semiconductor chips. Therefore, in the area of package technology, in accordance with a rapid increase in demand for small-sized semiconductor chips, or the like, the implementation of a semiconductor package having a compact size while including a plurality of pins has been demanded.

One type of package technology suggested to satisfy the technical demand as described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide an ultraminiature ultrathin fan-out semiconductor package having a fingerprint recognition function.

According to an aspect of the present disclosure, a fan-out semiconductor package may be provided, in which a first connection member having a through-hole in which a semiconductor chip is disposed and having a plurality of redistribution layers formed therein is introduced and a second connection member including redistribution layers including sensor patterns implementing a high sensitivity fingerprint recognition function is introduced to the semiconductor chip and the first connection member.

According to an aspect of the present disclosure, a fan-out semiconductor package may include: a first connection member having a through-hole; a semiconductor chip disposed in the through-hole of the first connection member and having an active surface with connection pads disposed thereon and an inactive surface opposing the active surface; an encapsulant encapsulating at least portions of the first connection member and the semiconductor chip; and a second connection member disposed on the first connection member and the semiconductor chip. The first connection member and the second connection member respectively include first redistribution layers and second redistribution layers electrically connected to the connection pads and formed of one or more layers, at least one of the first redistribution layers is disposed between a plurality of insulating layers constituting the first connection member, and at least one of the second redistribution layers includes sensor patterns recognizing a fingerprint.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
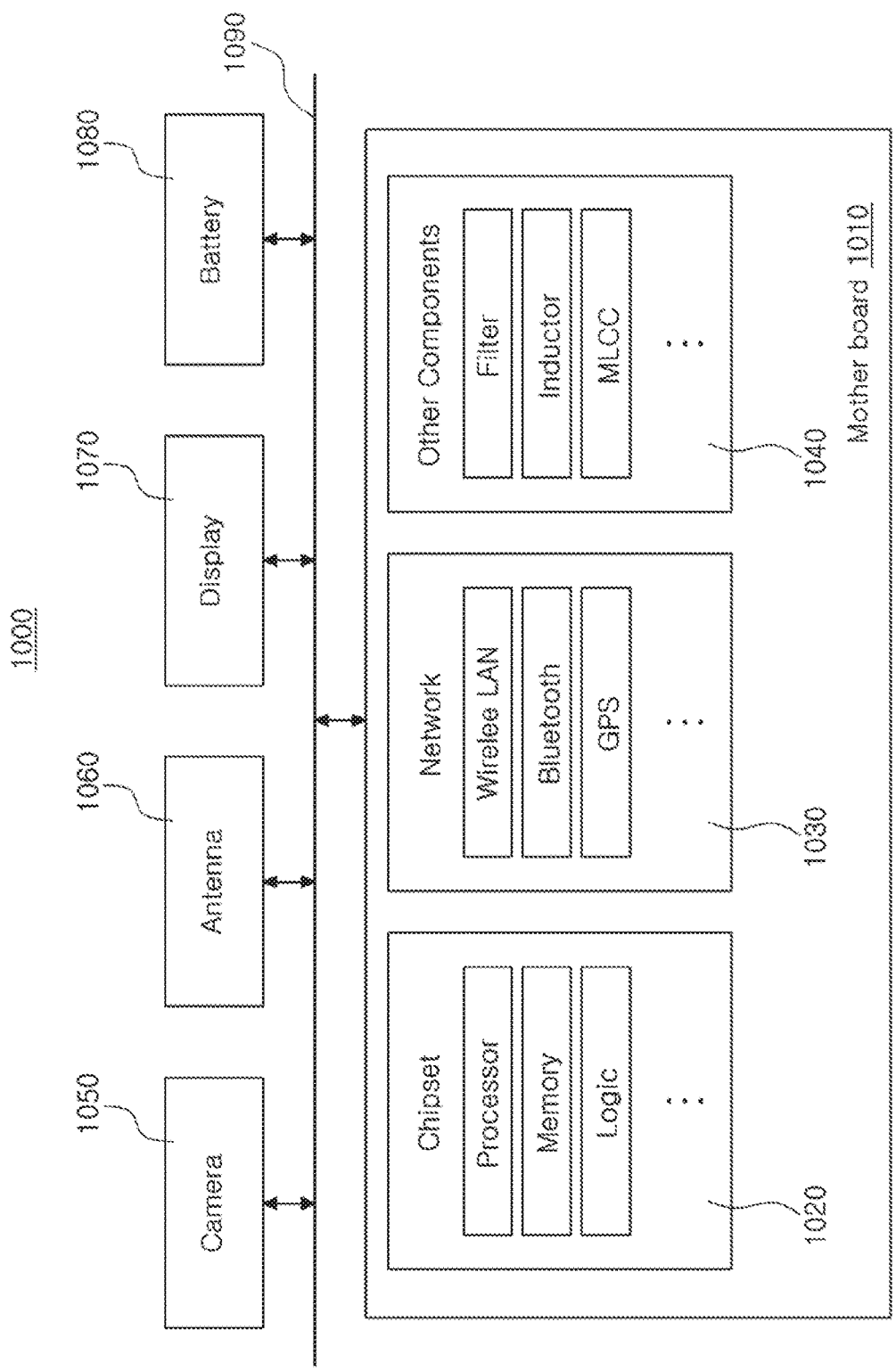
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided based on the attached drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a mother board 1010 therein. The mother board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
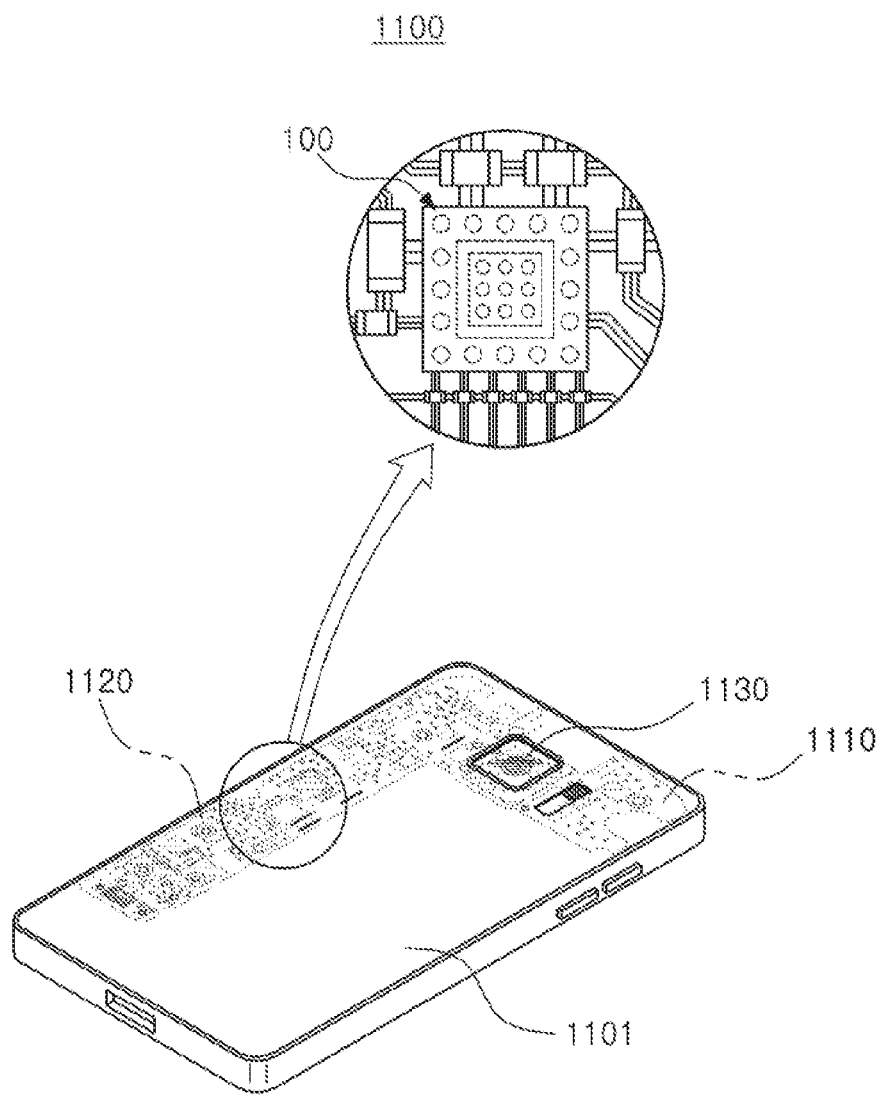
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
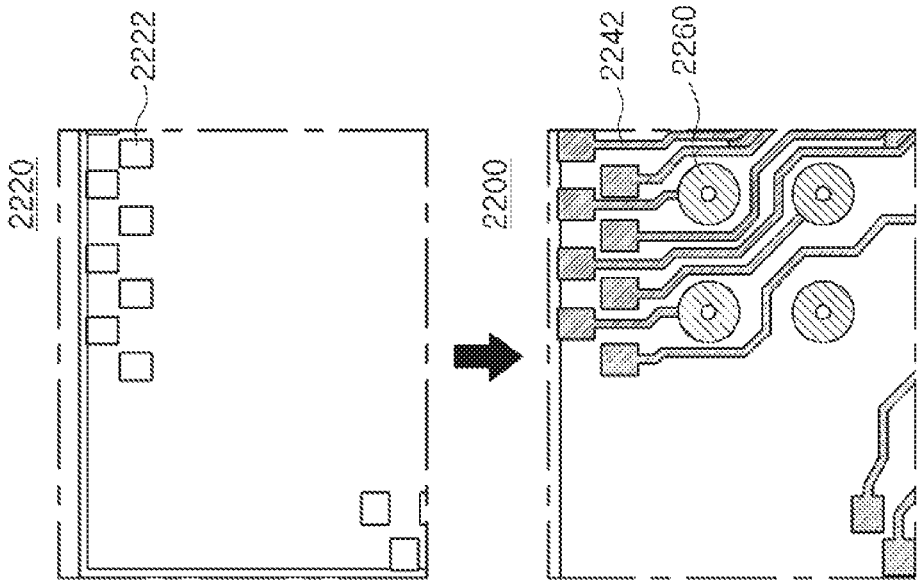
FIGS. 3A and 3B are schematic cross-sectional views illustrating states of a fan-in semiconductor package before and after being packaged.
Figure 3A:
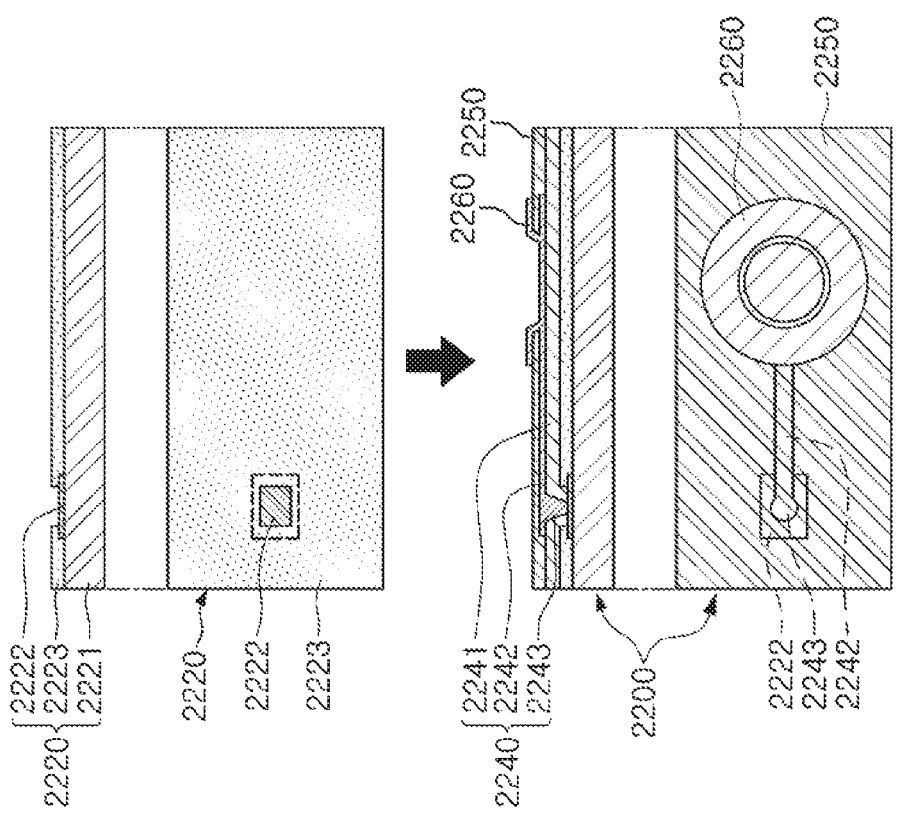

FIGS. 3A and 3B are schematic cross-sectional views illustrating states of a fan-in semiconductor package before and after being packaged.

Figure 4:
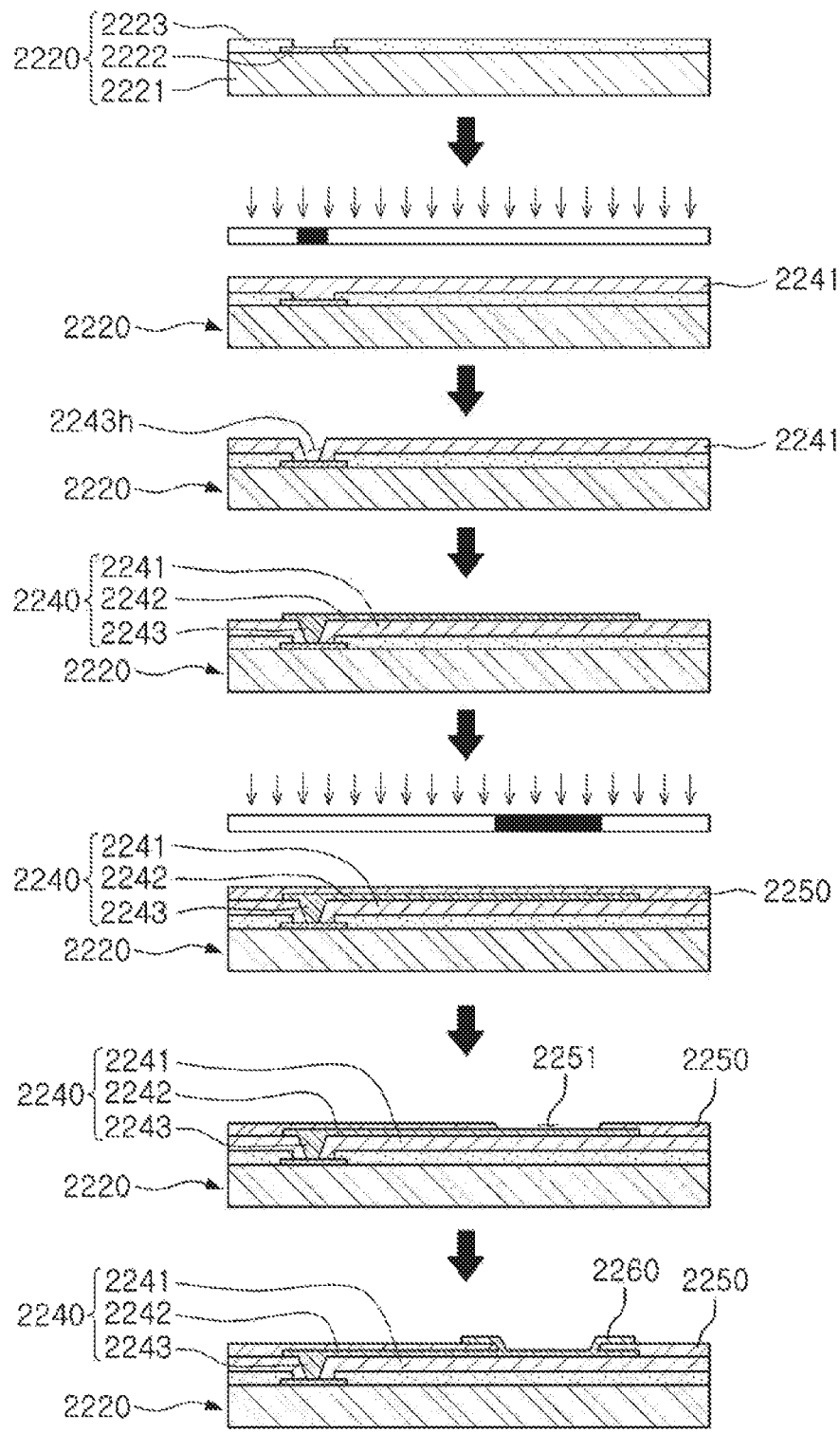
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, depending on a size of the semiconductor chip 2220, a connection member 2240 may be formed on the semiconductor chip 2220, in order to redistribute the connection pads 2222. The connection member 2240 may be formed by forming an insulating layer 2241 on the semiconductor chip 2220 using an insulating material such as a photoimagable dielectric (PID) resin, forming via holes 2243h exposing the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
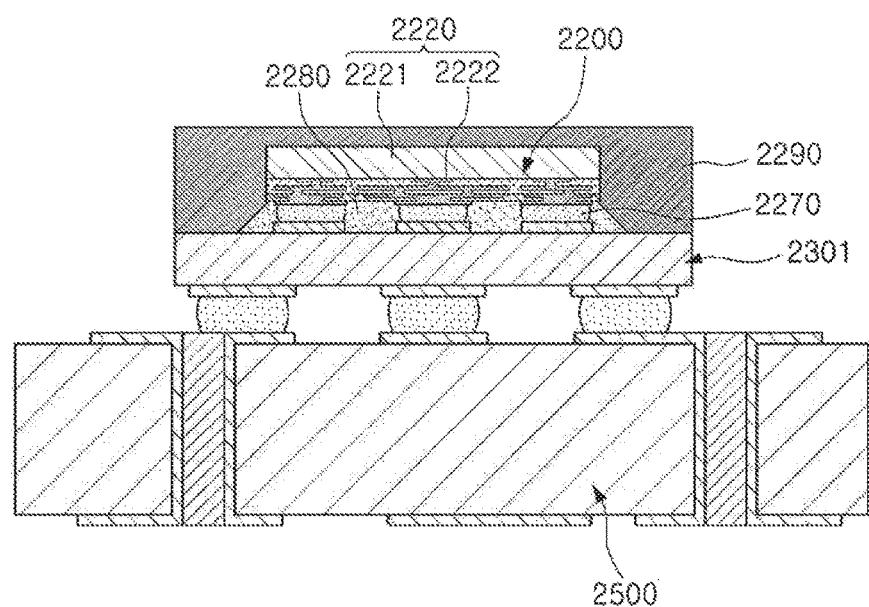
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
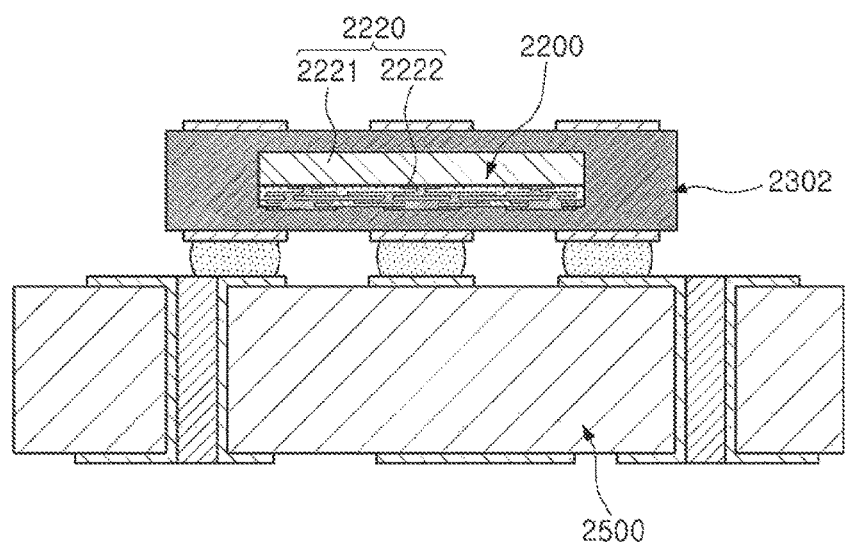
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
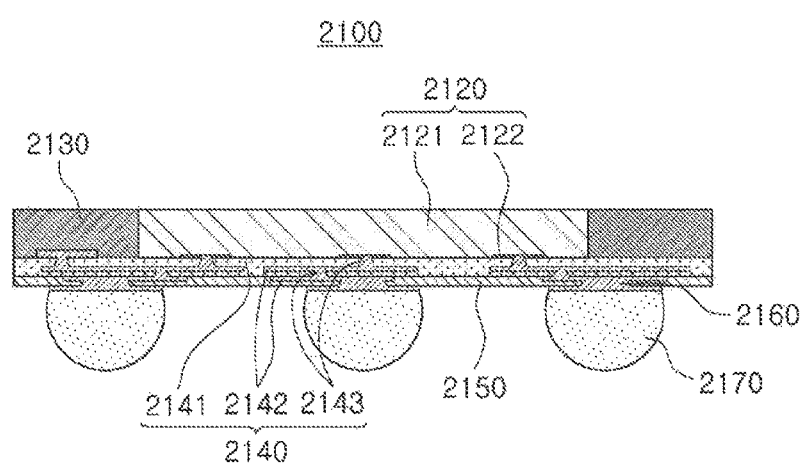
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
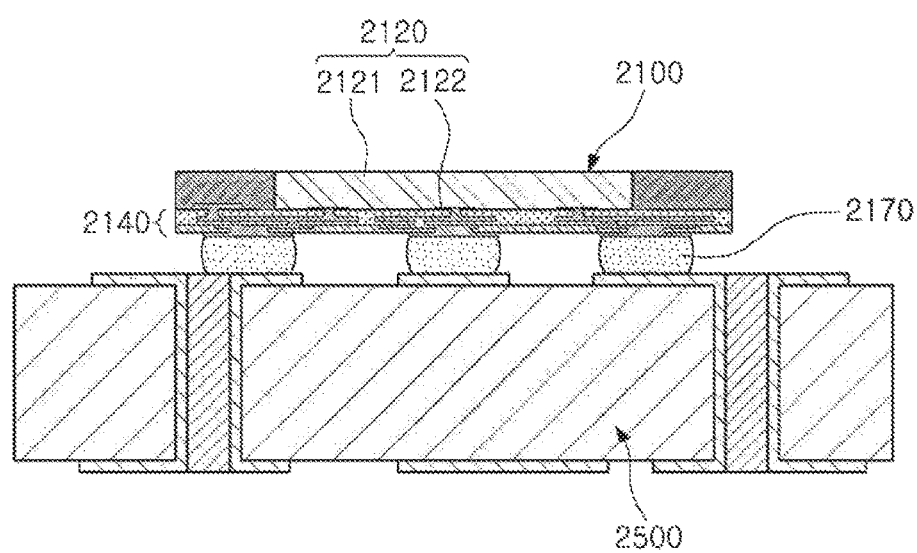
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of an area of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) form using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

An ultraminiature ultrathin fan-out semiconductor package having a fingerprint recognition function will be hereinafter described with reference to the drawings.

Figure 9:
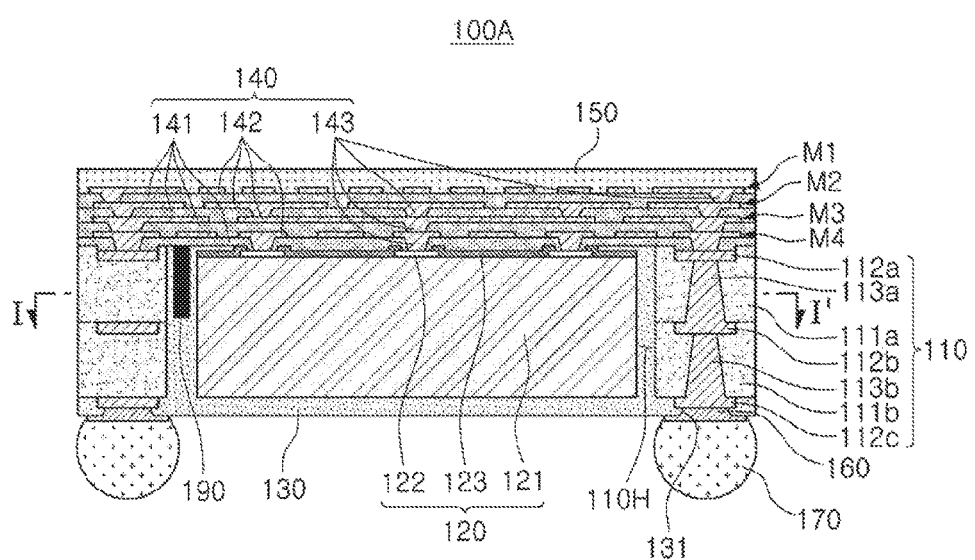
FIG. 9 is a schematic cross-sectional view illustrating an example of a fan-out semiconductor package.

FIG. 9 is a schematic cross-sectional view illustrating an example of a fan-out semiconductor package.

Figure 10:
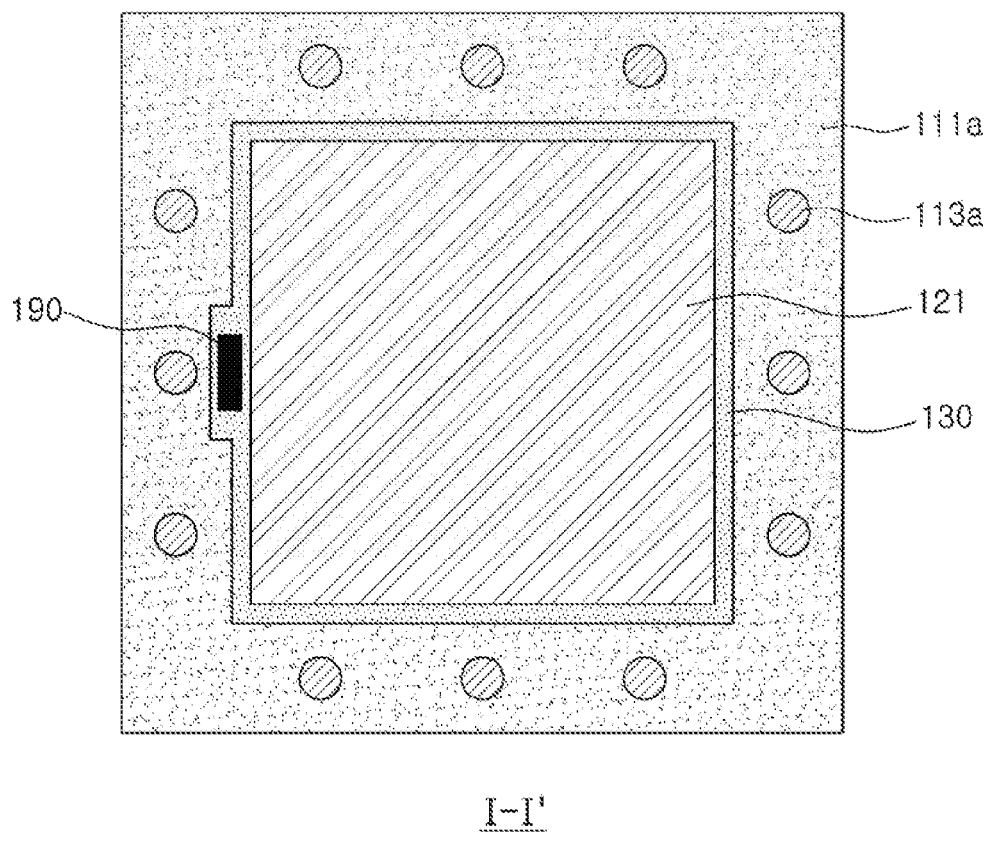
FIG. 10 is a schematic plan view of the fan-out semiconductor package taken along line I-I' of FIG. 9.

FIG. 10 is a schematic plan view of the fan-out semiconductor package taken along line I-I' of FIG. 9.

Figure 11:
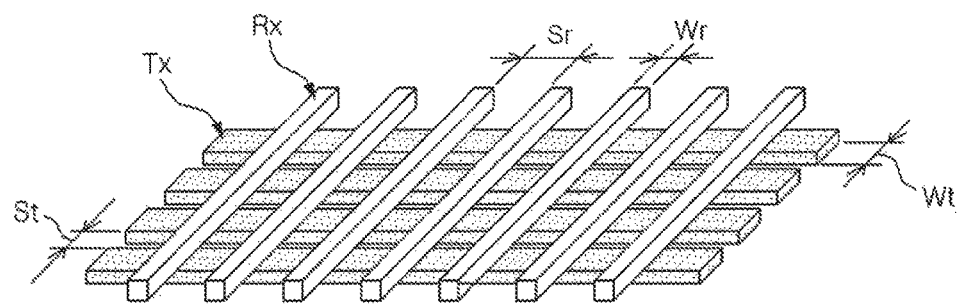
FIG. 11 is a view illustrating an example of M1 and M2 of the fan-out semiconductor package of FIG. 9.

FIG. 11 is a view illustrating an example of M1 and M2 of the fan-out semiconductor package of FIG. 9.

Figure 12:
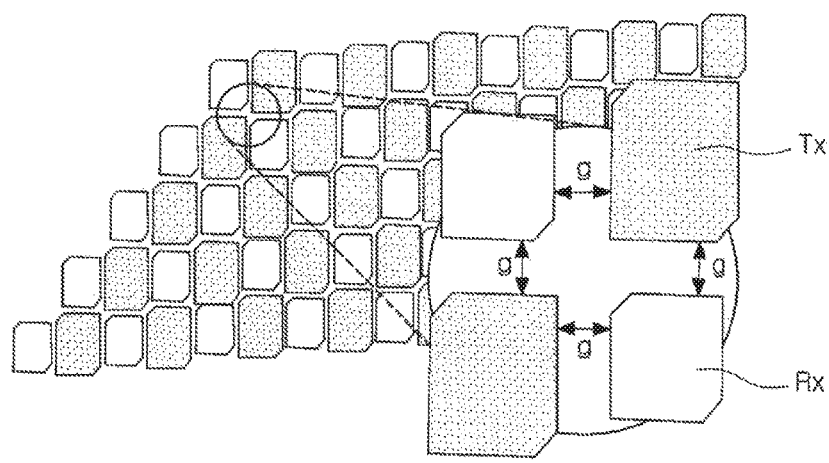
FIG. 12 is a view illustrating another example of M1 and M2 of the fan-out semiconductor package of FIG. 9.

FIG. 12 is a view illustrating another example of M1 and M2 of the fan-out semiconductor package of FIG. 9.

Referring to the drawings, a fan-out semiconductor package 100A according to an exemplary embodiment in the present disclosure may include a first connection member 110 having a through-hole 110H, a semiconductor chip 120 disposed in the through-hole 110H of the first connection member 110 and having an active surface with connection pads 122 disposed thereon and an inactive surface opposing the active surface, an encapsulant 130 encapsulating at least portions of the first connection member 110 and the semiconductor chip 120, and a second connection member 140 disposed on the first connection member 110 and the active surface of the semiconductor chip 120. The first connection member 110 may be connected to the semiconductor chip 120 through the second connection member 140. The first connection member 110 may include a plurality of redistribution layers 112a, 112b, and 112c electrically connected to the connection pads 122. The second connection member 140 may include a plurality of redistribution layers 142 electrically connected to the connection pads 122. One 112b of the plurality of redistribution layers 112a, 112b, and 112c of the first connection member 110 may be disposed between a plurality of insulating layers 111a and 111b constituting the first connection member 110. Redistribution layers M1 and M2 disposed at an outer side of the second connection member 140 among the plurality of redistribution layers 142 of the second connection member 140 may include sensor patterns Rx and Tx capable of recognizing a fingerprint by precisely detecting a change in a capacitance.

A structure of a fingerprint recognition sensor according to the related art was generally a four-layer cored-type general ball grid array (BGA) substrate structure based on a copper clad laminate (CCL). For example, a semiconductor chip was surface-mounted on a lower surface of a ball grid array substrate having a pattern having a fingerprint recognition sensor function formed thereon, using connection parts. Solder balls, or the like, were formed on the same level, to mount the ball grid array substrate having the semiconductor chip surface-mounted on the lower surface thereof on a main board of an electronic device. In such a substrate structure, it was difficult to form fine wirings on Tx and Rx layers and make the Tx and Rx layers ultrathin, which are important in improving transmitting and receiving sensitivity of a sensor, and it was technically difficult to secure perfect flatness of the outermost contact layer. In addition, it was necessary to use a ferroelectric insulating material in order to improve efficiency of touch sensing including the Tx and Rx layers, but it was difficult to use a material other than existing substrate materials. In addition, since the semiconductor chip and a passive component are mounted on a lower end portion of the substrate, a thickness of the semiconductor chip and a thickness of the passive component were limited, and a height of the solder balls needed to be high. Further, recently, customer's needs to easily change an entire thickness of the fingerprint recognition sensor from an ultrathin type to a thick plate type without changing a wiring layer in order for the fingerprint recognition sensor to be appropriate for various applications have increased. Therefore, the development of anew structure allowing the fingerprint recognition sensor to be appropriate for the various applications has been urgently demanded.

In the fan-out semiconductor package 100A according to the exemplary embodiment, the redistribution layers 142 of the second connection member 140 including the sensor patterns Tx and Rx may be manufactured by a semiconductor method to enable ultra-fine patterning and thinning of insulating layers, resulting in improving transmitting and receiving sensitivity of a sensor. In addition, in a case in which a thickness of the semiconductor chip 120 may be easily changed depending on desired specifications, an overall thickness of the fan-out semiconductor package 100A may be easily adjusted by adjusting a thickness of the first connection member 110. In addition, the semiconductor chip 120 may be disposed in the through-hole 110H of the first connection member 110, such that a height of connection terminals 170 for connecting the fan-out semiconductor package to a main board of an electronic device may be reduced. In addition, the redistribution layers 112a, 112b, and 112c may be formed in the first connection member 110 to further reduce a thickness and improve performance of the fan-out semiconductor package 100A. Particularly, the redistribution layer 112b may be formed between the insulating layers 111a and 111b constituting the first connection member 110 to significantly increase such an effect.

Meanwhile, the sensor patterns Tx and Rx may include Tx (Transfer Transistor) patterns and Rx (Reset Transistor) patterns formed on different layers M1 and M2. In this case, the Tx patterns and the Rx patterns may be disposed in a mesh form in relation to a transparent surface. In addition, when fine circuit technology is applied in forming the patterns, the Rx patterns may be formed so that a line width Wr thereof is narrow and an interval Sr therebetween is wide and the Tx patterns may be formed so that a line width Wt is wide and an interval St therebetween is narrow. Here, the line width Wt of the Tx patterns is greater than the line width Wr of the Rx patterns, and the interval St between the Tx patterns is smaller than the interval Sr between the Rx patterns. Therefore, the Tx patterns may easily transfer a signal recognized through a wide region to the Rx patterns, and the transferred signal may be transferred to other layers M3 and M4 through vias.

Alternatively, the sensor patterns Tx and Rx may include Tx patterns and Rx patterns formed on the same layer M1. In this case, one layer M2 may be omitted unlike in the case of the drawings. That is, the sensor patterns Tx and Rx may be formed on the same layer M1 using fine spacing technology. In this case, the Tx patterns and the Rx patterns may be alternately disposed in a diamond form while having a predetermined interval g therebetween to significantly increase sensing sensitivity. Individual pads of the Tx patterns may again be connected to each other on a layer M3 below the layer M1 through vias to improve sensing sensitivity. Pads of the Rx patterns may be connected to each other on the outermost layer M1 through a fine circuit. The Tx patterns and the Rx patterns may be alternately disposed in the diamond form while having a predetermined interval g therebetween. Certain forms of the Tx patterns and the Rx patterns are not particularly limited. For example, corners of the respective patterns may be rounded, unlike as depicted in the drawings.

Meanwhile, a passivation layer 150 may be further disposed on the second connection member 140. In this case, the passivation layer 150 may have a dielectric constant greater than that of an insulating layer 141 constituting the second connection member 140. That is, an insulating material having a high dielectric constant such as a ferroelectric insulating material may be used in the passivation layer 150 on which the sensor patterns Tx and Rx are disposed. In this case, the sensing sensitivity may be more effectively increased.

Meanwhile, at least one layer M3 of the redistribution layers 142 of the second connection member 140 may include an electromagnetic wave blocking pattern. The electromagnetic wave blocking pattern may have, for example, a plate shape. The electromagnetic wave blocking pattern may block electromagnetic waves generated by the semiconductor chip 120, or the like, a layer M4 having a routing pattern among the redistribution layers 142, or the like. The electromagnetic wave blocking pattern may also block electromagnetic waves generated by other components depending on a disposition form.

The respective components included in the fan-out semiconductor package 100A according to the exemplary embodiment will hereinafter be described in more detail.

The first connection member 110 may maintain rigidity of the fan-out semiconductor package 100A depending on certain materials, and serve to secure uniformity of a thickness of the encapsulant 130. The semiconductor chip 120 and the second connection member 120 may be electrically connected to the main board of the electronic device through the connection terminals 170, or the like, by the first connection member 110. The first connection member 110 may include the plurality of redistribution layers 112a, 112b, and 112c to effectively redistribute the connection pads 122 of the semiconductor chip 120, and may provide a wide wiring design region to significantly suppress a redistribution layer from being formed in other regions. The semiconductor chip 120 may be disposed in the through-hole 110H to be spaced apart from the first connection member 110 by a predetermined distance. Side surfaces of the semiconductor chip 120 may be surrounded by the first connection member 110. A separate passive component 190 such as a capacitor or an inductor may be further disposed in the through-hole 110H, and may be electrically connected to the semiconductor chip 120. However, this is only an example.

The first connection member 110 may include a first insulating layer 111a, a first redistribution layer 112a in contact with the second connection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to the connection pads 122. The first and second redistribution layers 112a and 112b and the second and third redistribution layers 112b and 112c may be electrically connected to each other by first and second vias 113a and 113b penetrating through the first and second insulating layers 111a and 111b, respectively.

Since the first redistribution layer 112a is embedded in the first insulating layer 111a, an insulating distance of the insulating layer 141 of the second connection member 140 may be substantially constant. Since the first connection member 110 may include a large number of redistribution layers 112a, 112b, and 112c, the second connection member 140 may be further simplified. Therefore, a decrease in a yield depending on a defect occurring in a process of forming the second connection member 140 may be suppressed, and the second connection member 140 may be thinned. The first redistribution layer 112a may be recessed into the first insulating layer 111a, such that a lower surface of the first insulating layer 111a and a lower surface of the first redistribution layer 112a have a step therebetween. Resultantly, when an encapsulant 130 is formed, a phenomenon in which a material of the encapsulant 130 bleeds to pollute the first redistribution layer 112a may be prevented.

The lower surface of the first redistribution layer 112a of the first connection member 110 may be disposed on a level above a lower surface of the connection pad 122 of the semiconductor chip 120. In addition, a distance between the redistribution layer 142 of the second connection member 140 and the first redistribution layer 112a of the first connection member 110 may be greater than that between the redistribution layer 142 of the second connection member 140 and the connection pad 122 of the semiconductor chip 120. Here, the first redistribution layer 112a may be recessed into the first insulating layer 111a. The second redistribution layer 112b of the first connection member 110 may be disposed on a level between the active surface and the inactive surface of the semiconductor chip 120. The first connection member 110 may be formed to have a thickness corresponding to that of the semiconductor chip 120. Therefore, the second redistribution layer 112b formed in the first connection member 110 may be disposed on a level between the active surface and the inactive surface of the semiconductor chip 120.

Thicknesses of the redistribution layers 112a, 112b, and 112c of the first connection member 110 may be greater than that of the redistribution layer 142 of the second connection member 140. Since the first connection member 110 may have a thickness equal to or greater than that of the semiconductor chip 120, the redistribution layers 112a, 112b, and 112c may be formed at large sizes depending on a scale of the first connection member 110. On the other hand, the redistribution layers 142 of the second connection member 140 formed through a fine circuit process such as a semiconductor process may be formed at a relatively small size for thinness.

For example, a material including an inorganic filler and an insulating resin may be used as materials of the insulating layers 111a and 111b. For example, a thermosetting resin such as an epoxy resin, a thermoplastic resin such as a polyimide resin, or a resin including a reinforcing material such as an inorganic filler, for example, silica, alumina, or the like, more specifically, Ajinomoto Build up Film (ABF), FR-4, Bismaleimide Triazine (BT), a photoimagable dielectric (PID) resin, BT, or the like, may be used. Alternatively, a material in which a thermosetting resin or a thermoplastic resin is impregnated together with an inorganic filler in a core material such as a glass fiber (or a glass cloth or a glass fabric), for example, prepreg, or the like, may also be used as the insulating material.

The redistribution layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, and 112c may perform various functions depending on designs of corresponding layers. For example, the redistribution layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a, 112b, and 112c may include pad patterns for vias, pad patterns for connection terminals, and the like.

A material of each of the vias 113a and 113b may be a conductive material. Each of the vias 113a and 113b may be completely filled with the conductive material, or the conductive material may also be formed along a wall of each of via holes. When holes for the vias 113a and 113b are formed, some of the pad patterns of the first redistribution layer 112a and the second redistribution layer 112b may serve as a stopper, and it may be thus advantageous in a process that each of the vias 113a and 113b has a tapered shape of which a width of an upper surface is greater than that of a lower surface. In this case, the vias 113a and 113b may be integrated with portions of the second redistribution layer 112b and the third redistribution layer 112c, respectively.

The semiconductor chip 120 may be an integrated circuit (IC) provided in an amount of several hundreds to several millions of elements or more integrated in a single chip. The integrated circuit may be, for example, an application specific integrated circuit (ASIC) capable of performing fingerprint recognition sensor processing. The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions.

The encapsulant 130 may protect the semiconductor chip 120. An encapsulation form of the encapsulant 130 is not particularly limited, and may be a form in which the encapsulant 130 surrounds at least portions of the semiconductor chip 120. For example, the encapsulant 130 may cover at least portions of the first connection member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second connection member 140. Certain materials of the encapsulant 130 are not particularly limited. For example, an insulating material may be used as the certain materials of the encapsulant 130. In this case, the insulating material may be a thermosetting resin such as an epoxy resin, a thermoplastic resin such as a polyimide resin, a resin having a reinforcing material such as an inorganic filler impregnated in the thermosetting resin and the thermoplastic resin, for example, ABF, FR-4, BT, a PID resin, or the like. In addition, a known molding material such as an epoxy molding compound (EMC), or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

The second connection member 140 may redistribute the connection pads 122 of the semiconductor chip 120 and may include the redistribution layers 142 capable of implementing a high sensitivity fingerprint recognition function. Several tens to several hundreds of connection pads 122 having various functions may be redistributed by the second connection member 140, and may be physically or electrically connected to an external source through the connection terminals 170 depending on the functions. In addition, a fingerprint recognition function that is to implement the high sensitivity fingerprint recognition function may be implemented. The second connection member 140 may include insulating layers 141, the redistribution layers 142 disposed on the insulating layers 141, and vias 143 penetrating through the insulating layers 141 and connected to the redistribution layers 142.

For example, an insulating material may be used as a material of the insulating layer 141. In this case, the insulating material may be a thermosetting resin such as an epoxy resin, a thermoplastic resin such as a polyimide resin, a resin having a reinforcing material such as an inorganic filler impregnated in the thermosetting resin and the thermoplastic resin, for example, ABF, FR-4, BT, a PID resin, or the like. It may be advantageous in forming fine patterns that a photosensitive insulating material such as a PID resin is used as the material of the insulating layer. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may include the layers M1 and M2 capable of performing a fingerprint recognition function, the layer M3 capable of performing a shield function, and the layer M4 capable of performing a redistribution function. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the layer M1 may include the Rx patterns and the Tx patterns, or the layers M1 and M2 may include the Rx patterns and the Tx patterns. The layer M3 may include the electromagnetic wave blocking patterns. The layer M4 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, these layers M1 to M4 may include various kinds of pad patterns.

The vias 143 may electrically connect the connection pads 122, the redistribution layers 142, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have all of the shapes known in the related art, such as a tapered shape, a cylindrical shape, and the like.

The passivation layer 150 may protect the second connection member 140 from external physical or chemical damage. The passivation layer 150 may be the outermost layer touched by a fingerprint. A material of the passivation layer 150 is not particularly limited, but may be the known insulating material. However, a ferroelectric insulating layer may be used as the material of the passivation layer 150 in order to improve efficiency of touch sensing. For example, the dielectric constant of the passivation layer 150 may be greater than that of the insulating layer 141 of the second connection member 140.

An underbump metal layer 160 may be additionally configured to improve connection reliability of the connection terminals 170 and improve board level reliability of the fan-out semiconductor package 100A. The underbump metal layer 160 may be connected to the third redistribution layer 112c of the first connection member 110 opened through openings 131 of the encapsulant 130. The underbump metal layer 160 may be formed in the openings 131 of the encapsulant 130 by the known metallization method using the known conductive metal such as a metal, but is not limited thereto.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or monolayer structure. When the connection terminals 170 are formed as a multilayer structure, the connection terminals 170 may include a copper (Cu) pillar and a solder. When the connection terminals 170 are formed as a monolayer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less. When the connection terminals 170 are solder balls, the connection terminals 170 may cover side surfaces of the underbump metal layer 160 extending onto a lower surface of the encapsulant 130, and connection reliability may be more excellent.

At least one of the connection terminals 170 may be disposed in a fan-out region. The fan-out region is a region except for the region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

Meanwhile, although not illustrated in the drawings, a metal layer may be further disposed on a wall of the through-hole 110H, if necessary. The metal layer may serve to effectively dissipate heat generated by the semiconductor chip 120. In addition, the metal layer may also serve to block electromagnetic waves. In addition, the number of through-holes 110H may be plural and semiconductor chips 120 or passive components may be disposed in the through-holes 110H, respectively. In addition to the structures described above, the structures known in the related art may be applied.

Figure 13:
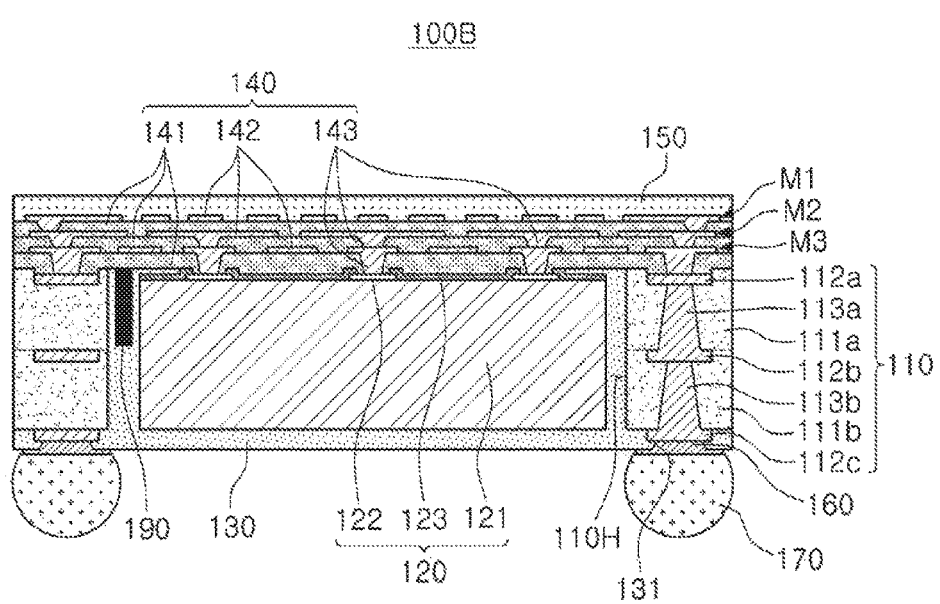
FIG. 13 is a schematic cross-sectional view illustrating a modified example of the fan-out semiconductor package of FIG. 9.

FIG. 13 is a schematic cross-sectional view illustrating a modified example of the fan-out semiconductor package of FIG. 9.

Referring to the drawing, in a fan-out semiconductor package 100B according to the modified example, redistribution layers 142 of a second connection member 140 may include layers M1 and M2 capable of performing a fingerprint recognition function and a layer M3 capable of performing a redistribution function. A layer capable of performing a shield function may be omitted. In this case, an insulating layer, most adjacent to the semiconductor chip 120, of the insulating layers 141 of the second connection member 140 may have a thickness greater than those of the other insulating layers. A shield function may be performed through such a difference in thickness, such that the second connection member may be further thinned. Meanwhile, the layers M1 and M2 may also be desired as one layer depending on designs of sensor patterns Tx and Rx. Descriptions of configurations overlapping that provided above are omitted hereinafter.

Figure 14:
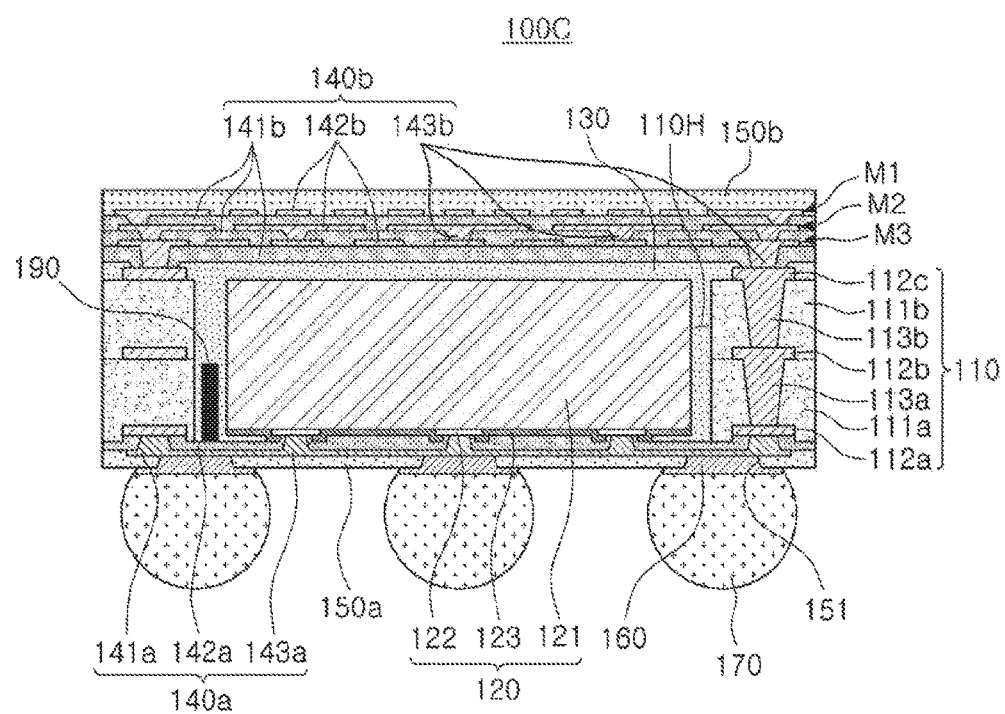
FIG. 14 is a schematic cross-sectional view illustrating another modified example of the fan-out semiconductor package of FIG. 9.

FIG. 14 is a schematic cross-sectional view illustrating another modified example of the fan-out semiconductor package of FIG. 9.

Referring to the drawing, in a fan-out semiconductor package 100C according to another modified example, a semiconductor chip 120 may be disposed in a face-down form in the drawing. In this case, a second connection member 140b including redistribution layers 142b including several layers M1 to M3 performing the various functions described above may be disposed on an inactive surface of the semiconductor chip 120, and a third connection member 140a including a redistribution layer 142a of which the main purpose is to redistribute connection pads 122 of the semiconductor chip 120 may be disposed on an active surface of the semiconductor chip 120. The second connection member 140b and the third connection member 140a may be connected to each other by a first connection member 110. An insulating layer 141b of the second connection member 140b may be formed of an insulating material such as PID, and the redistribution layer 142b and vias 143b of the second connection member 140b may be formed of the known conductive material such as copper (Cu), or the like. An insulating layer 141a of the third connection member 140a may be formed of an insulating material such as PID, and the redistribution layer 142a and vias 143a of the third connection member 140a may be formed of the known conductive material such as copper (Cu), or the like. The layers M1 to M3 of the second connection member 140b may be modified as described above depending on designs. Descriptions of configurations overlapping that provided above are omitted hereinafter.

Figure 15:
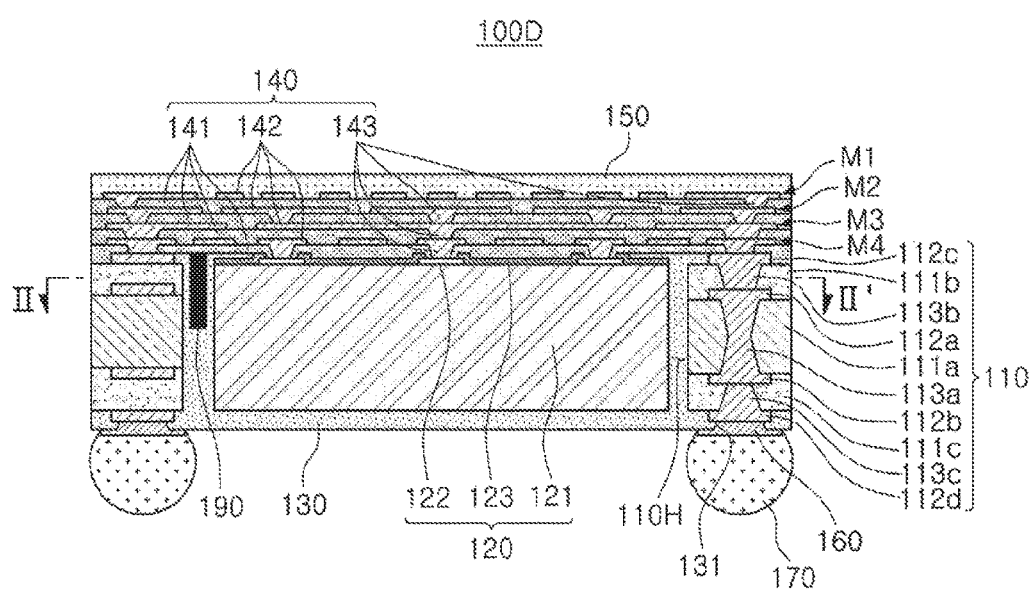
FIG. 15 is a schematic cross-sectional view illustrating another example of a fan-out semiconductor package.

FIG. 15 is a schematic cross-sectional view illustrating another example of a fan-out semiconductor package.

Figure 16:
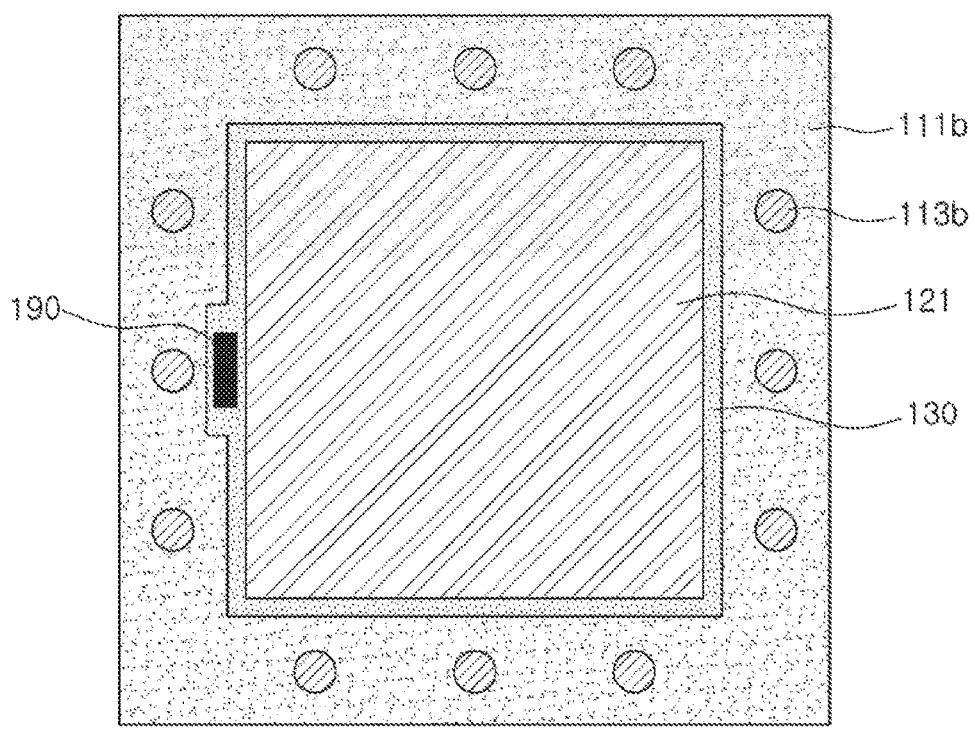
FIG. 16 is a schematic plan view of the fan-out semiconductor package taken along line II-II' of FIG. 15.

FIG. 16 is a schematic plan view of the fan-out semiconductor package taken along line II-II' of FIG. 15.

Referring to the drawings, in a fan-out semiconductor package 100D according to another exemplary embodiment in the present disclosure, a first connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the first connection member 110 may include a larger number of redistribution layers 112a, 112b, 112c, and 112d, a second connection member 140 may be further simplified. The first to fourth redistribution layers 112a, 112b, 112c, and 112d may be electrically connected to each other by first to third vias 113a, 113b, and 113c penetrating through the first to third insulating layers 111a, 111b, and 111c, respectively.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto. Similarly, the first via 113a may have a diameter greater than those of the second via 113b and the third via 113c.

A lower surface of the third redistribution layer 112c of the first connection member 110 may be disposed on a level below a lower surface of the connection pad 122 of a semiconductor chip 120. In addition, a distance between a redistribution layer 142 of the second connection member 140 and the third redistribution layer 112c of the first connection member 110 may be smaller than that between the redistribution layer 142 of the second connection member 140 and the connection pad 122 of the semiconductor chip 120. Here, the third redistribution layer 112c may be disposed in a protruding form on the second insulating layer 111b, resulting in contact with the second connection member 140. The first redistribution layer 112a and the second redistribution layer 112b of the first connection member 110 may be disposed on a level between an active surface and an inactive surface of the semiconductor chip 120. The first connection member 110 may be formed at a thickness corresponding to that of the semiconductor chip 120. Therefore, the first redistribution layer 112a and the second redistribution layer 112b formed in the first connection member 110 may be disposed on a level between the active surface and the inactive surface of the semiconductor chip 120.

Thicknesses of the redistribution layers 112a, 112b, 112c, and 112d of the first connection member 110 may be greater than that of the redistribution layer 142 of the second connection member 140. Since the first connection member 110 may have a thickness equal to or greater than that of the semiconductor chip 120, the redistribution layers 112a, 112b, 112c, and 112d may also be formed to have large sizes. On the other hand, the redistribution layer 142 of the second connection member 140 may be formed at a relatively small size for thinness. Descriptions of configurations overlapping that provided above are omitted hereinafter.

Figure 17:
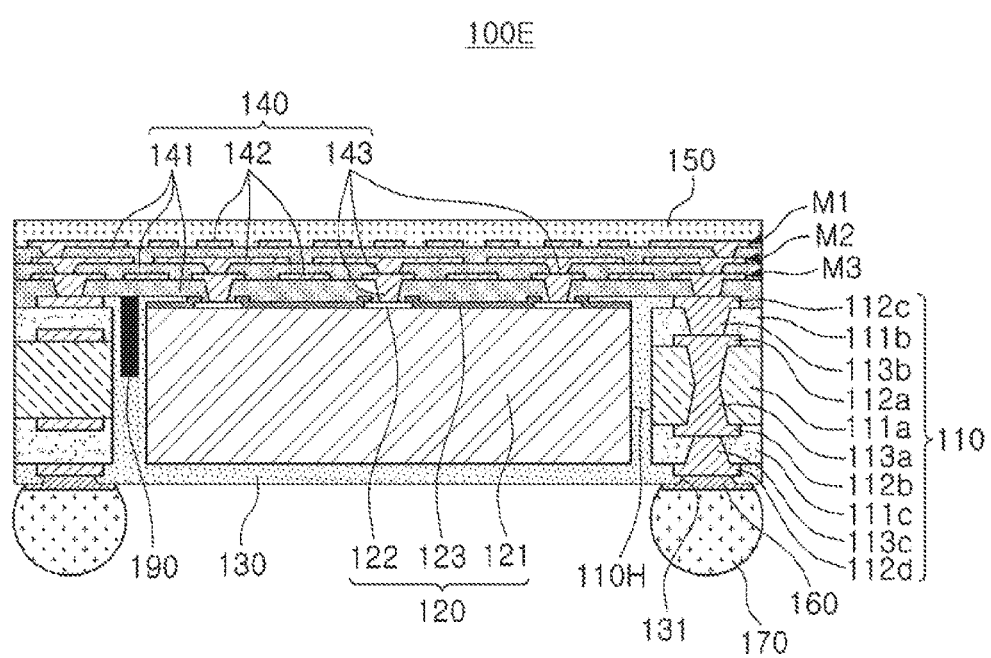
FIG. 17 is a schematic cross-sectional view illustrating a modified example of the fan-out semiconductor package of FIG. 15.

FIG. 17 is a schematic cross-sectional view illustrating a modified example of the fan-out semiconductor package of FIG. 15.

Referring to the drawing, in a fan-out semiconductor package 100D according to the modified example, redistribution layers 142 of a second connection member 140 may include layers M1 and M2 capable of performing a fingerprint recognition function and a layer M3 capable of performing a redistribution function. A layer capable of performing a shield function may be omitted. In this case, an insulating layer, most adjacent to the semiconductor chip 120, of the insulating layers 141 of the second connection member 140 may have a thickness greater than those of the other insulating layers. A shield function may be performed through such a thickness difference, such that the second connection member may be further thinned. Meanwhile, the layers M1 and M2 may also be desired as one layer depending on designs of sensor patterns Tx and Rx. Descriptions of configurations overlapping that provided above are omitted hereinafter.

Figure 18:
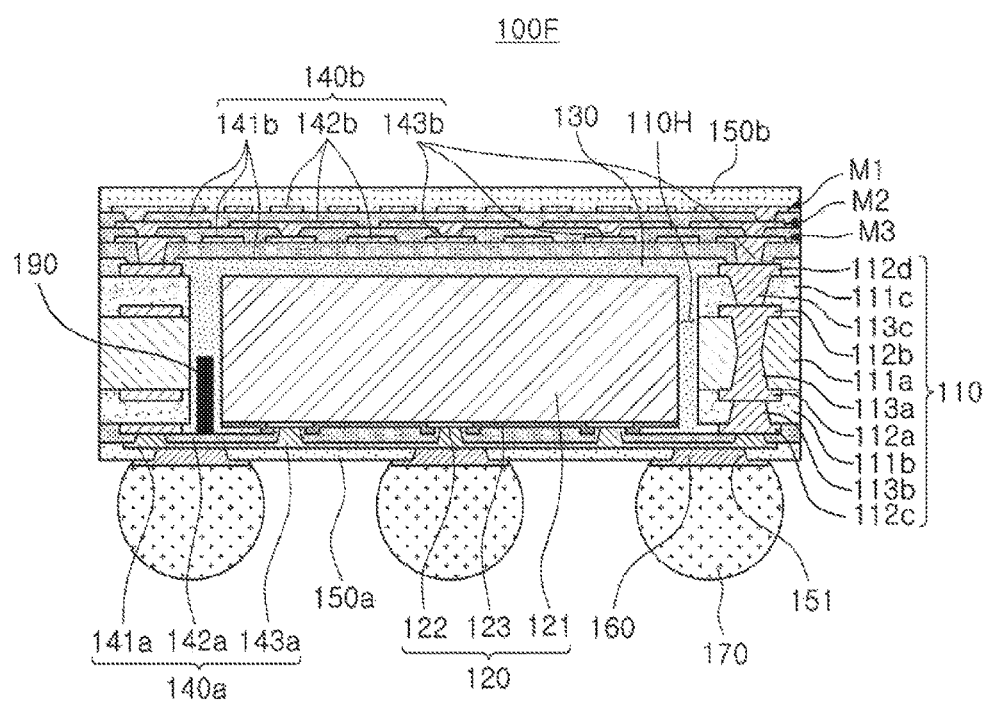
FIG. 18 is a schematic cross-sectional view illustrating another modified example of the fan-out semiconductor package of FIG. 15.

FIG. 18 is a schematic cross-sectional view illustrating another modified example of the fan-out semiconductor package of FIG. 15.

Referring to the drawing, in a fan-out semiconductor package 100F according to another modified example, a semiconductor chip 120 may be disposed in a face-down form in the drawing. In this case, a second connection member 140b including redistribution layers 142b including several layers M1 to M3 performing the various functions described above may be disposed on an inactive surface of the semiconductor chip 120, and a third connection member 140a including a redistribution layer 142a of which the main purpose is to redistribute connection pads 122 of the semiconductor chip 120 may be disposed on an active surface of the semiconductor chip 120. The second connection member 140b and the third connection member 140a may be connected to each other by a first connection member 110. An insulating layer 141b of the second connection member 140b may be formed of an insulating material such as PID, and the redistribution layer 142b and vias 143b of the second connection member 140b may be formed of the known conductive material such as copper (Cu), or the like. An insulating layer 141a of the third connection member 140a may be formed of an insulating material such as PID, and the redistribution layer 142a and vias 143a of the third connection member 140a may be formed of the known conductive material such as copper. The layers M1 to M3 of the second connection member 140b may be modified as described above depending on designs. Descriptions of configurations overlapping that provided above are omitted hereinafter.

As set forth above, according to the exemplary embodiments in the present disclosure, an ultraminiature ultrathin fan-out semiconductor package having a fingerprint recognition function may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
    first insulating layers having a through-hole penetrating through outermost surfaces of the first insulating layers opposing each other;
    first redistribution layers disposed on or in the first insulating layer, respectively;
    first vias disposed in the first insulating layers, respectively, and electrically connecting the first redistribution layers to each other;
    a semiconductor chip disposed in the through-hole of the first insulating layers, and having an active surface with connection pads disposed thereon and an inactive surface opposing the active surface;
    an encapsulant covering one of the inactive surface and the active surface of the semiconductor chip, covering one of the outermost surfaces of the first insulating layers, and extending continuously from the covered surface of the semiconductor and the covered outermost surface of the first insulating layers to fill at least a portion of the through-hole;
    second insulating layers and second redistribution layers alternatively disposed on the semiconductor chip, the first insulating layers, and the first redistribution layers; and
    second vias disposed in the second insulating layers, respectively, and electrically connecting the second redistribution layers to each other,
    wherein the second redistribution layers are electrically connected to the connection pads,
    at least one of the second redistribution layers includes sensor patterns recognizing a fingerprint and protrudes from one of the second insulating layers, and
    the one of the second insulating layers, from which the at least one of the second redistribution layers including the sensor patterns protrudes, is disposed between the semiconductor chip and the at least one of the second redistribution layers including the sensor patterns.

2. The fan-out semiconductor package of claim 1, wherein the sensor patterns include Tx patterns and Rx patterns formed on different layers, and
    the Tx patterns and the Rx patterns are disposed in a mesh form.

3. The fan-out semiconductor package of claim 2, wherein a line width of the Tx patterns is greater than that of the Rx patterns, and
    an interval between the Tx patterns is smaller than that between the Rx patterns.

4. The fan-out semiconductor package of claim 1, wherein the sensor patterns include Tx patterns and Rx patterns formed on the same layer, and
   the Tx patterns and the Rx patterns are alternatively disposed in a diamond form.

5. The fan-out semiconductor package of claim 1, further comprising a passivation layer disposed on the second connection insulating layers,
   wherein the passivation layer has a dielectric constant greater than those of the second insulating layers.

6. The fan-out semiconductor package of claim 1,
   wherein at least one of the second redistribution layers includes an electromagnetic wave blocking pattern.

7. The fan-out semiconductor package of claim 1, wherein an insulating layer, most adjacent to the semiconductor chip, of the second insulating layers, has a thickness greater than those of the other of the second insulating layers.

8. The fan-out semiconductor package of claim 1,
   wherein the second insulating layers and the second redistribution layers are alternately disposed on the active surface of the semiconductor chip, and
   the first redistribution layers are electrically connected to the semiconductor chip at least by the second redistribution layers.

9. The fan-out semiconductor package of claim 1, further comprising third redistribution layers and third insulating layers alternately disposed on the active surface the semiconductor chip, the first insulating layers, the first redistribution layers,
   wherein the third redistribution layers are electrically connected to the connection pads,
   the second redistribution layers and the second insulating layers are alternately disposed on the inactive surface of the semiconductor chip, and
   the second redistribution layers and the third redistribution layers are connected to each other at least by the first redistribution layers.

10. The fan-out semiconductor package of claim 1, further comprising a passive component disposed in the through-hole,
    wherein the passive component is electrically connected to the connection pads.

11. The fan-out semiconductor package of claim 1, wherein one of the first redistribution layers is embedded in an outermost one among the first insulating layers.

12. The fan-out semiconductor package of claim 11, wherein a lower surface of the one of the first redistribution layers has a step with respect to a lower surface of the outermost one among the first insulating layers.

13. The fan-out semiconductor package of claim 1, wherein outermost ones of the first redistribution layers protrude on outermost ones of the first insulating layers, respectively.

14. The fan-out semiconductor package of claim 13, wherein the number of the first insulating layers is three and the number of the first redistribution is four.

15. The fan-out semiconductor package of claim 14, wherein a center one of the first insulating layers has a thickness greater than that those of the other first insulating layers.

16. The fan-out semiconductor package of claim 1, where the encapsulant extends continuously from the through-hole to a region between the semiconductor chip and an insulating layer, most adjacent to the semiconductor chip, among the second insulating layers.

17. A fan-out semiconductor package comprising:
    first insulating layers having a through-hole penetrating through outermost surfaces of the first insulating layers opposing each other;
    first redistribution layers alternately disposed separated by the first insulating layers; first vias disposed in the first insulating layers, respectively, and electrically connecting the first redistribution layers to each other;
    a semiconductor chip disposed in the through-hole of the first insulating layers, and having an active surface with connection pads disposed thereon and an inactive surface opposing the active surface;
    an encapsulant encapsulating at least portions of the first connection member and the semiconductor chip;
    second insulating layers and second redistribution layers alternately disposed on one side of the semiconductor chip, the first insulating layers, and the first redistribution layers; and
    second vias disposed in the second insulating layers, respectively, and electrically connecting the second redistribution layers to each other,
    wherein the second redistribution layers are electrically connected to the connection pads,
    one of the second redistribution layers includes sensor patterns recognizing a fingerprint and protrudes from one of the second insulating layers, and another of second redistribution layers includes an electromagnetic wave blocking pattern disposed between the semiconductor chip and the sensor patterns, and
    the one of the second insulating layers, from which the one of the second redistribution layers including the sensor patterns protrudes, is disposed between the semiconductor chip and the one of the second redistribution layers including the sensor patterns.

18. The fan-out semiconductor package of claim 17, wherein the second redistribution layers include one layer disposed between the electromagnetic wave blocking pattern and the semiconductor chip and electrically connected to the connection pads of the semiconductor chip.

19. A fan-out semiconductor package comprising:
    a first insulating layer having a through-hole;
    a semiconductor chip disposed in the through-hole of the first insulating layer, and having an active surface with connection pads disposed thereon and an inactive surface opposing the active surface;
    an encapsulant covering one of the inactive surface and the active surface of the semiconductor chip, covering one of major surfaces of the first insulating layer, and extending continuously from the covered surface of the semiconductor chip and the covered major surface of the first insulating layer to fill at least a portion of the through-hole;
    a first upper redistribution layer, a first upper insulating layer, a second upper redistribution layer, and a second upper insulating layer sequentially disposed on the semiconductor chip and the first insulating layer;
    a lower redistribution layer disposed between the second upper insulating layer and the semiconductor chip; and
    a lower insulating layer, from which the lower redistribution layer protrudes, disposed between the lower redistribution layer and the semiconductor chip,
    wherein the first and second upper redistribution layers and the lower redistribution layer are electrically connected to the connection pads,
    the first and second upper redistribution layers each include sensor patterns recognizing a fingerprint, and protrude from the first and second upper insulating layers, respectively, and the lower insulating layer is in physical contact with the semiconductor chip.

20. The fan-out semiconductor package of claim 19, wherein the first and second upper redistribution layers, the lower redistribution layer, the first and second upper insulating layers, and the lower insulating layer are disposed on a side of the active surface of the semiconductor chip, and
the fan-out semiconductor package further comprises another lower redistribution layer including an electromagnetic wave blocking pattern disposed between the second upper redistribution layer and the lower redistribution layer.

* * * * *